United States Patent
Meyer et al.

(10) Patent No.: US 7,208,345 B2
(45) Date of Patent: Apr. 24, 2007

(54) METHOD OF MANUFACTURING A SEMICONDUCTOR DEVICE COMPRISING STACKED CHIPS AND A CORRESPONDING SEMICONDUCTOR DEVICE

(75) Inventors: Thorsten Meyer, Regensburg (DE); Harry Hedler, Germering (DE)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 11/126,392

(22) Filed: May 11, 2005

(65) Prior Publication Data
US 2006/0258044 A1     Nov. 16, 2006

(51) Int. Cl.
*H01L 21/48* (2006.01)
*H01L 21/50* (2006.01)
(52) U.S. Cl. .................. 438/109; 438/113; 438/462; 257/E21.502
(58) Field of Classification Search ............. 438/106, 438/107, 109, 110, 113, 460, 462
See application file for complete search history.

(56) References Cited

U.S. PATENT DOCUMENTS

| | | | |
|---|---|---|---|
| H000208 H | * | 2/1987 | Ng et al. ................ 257/737 |
| 6,337,227 B1 | * | 1/2002 | Ball ........................ 438/113 |
| 6,472,758 B1 | * | 10/2002 | Glenn et al. ............. 257/777 |

* cited by examiner

*Primary Examiner*—Scott B. Geyer
(74) *Attorney, Agent, or Firm*—Morrison & Foerster LLP (57) ABSTRACT

A first reconstituted wafer is formed, followed by a first redistribution layer. In parallel, a second reconstituted wafer is formed. The second reconstituted wafer is diced along a gap such that individualized embedded chips are formed having tilted sidewalls defining an angle of more than 90 degrees with respect to the active surface of the reconstituted wafer. The embedded chips are placed with the backside on an active surface of the first reconstituted wafer on the first redistribution layer. Afterwards, a second redistribution layer is formed on the active surface of the embedded chips and tilted sidewalls wherein the second redistribution layer connects contact pads of the second chips with the first redistribution layer.

7 Claims, 7 Drawing Sheets

METHOD OF MANUFACTURING A SEMICONDUCTOR DEVICE COMPRISING STACKED CHIPS AND A CORRESPONDING SEMICONDUCTOR DEVICE

TECHNICAL FIELD OF THE INVENTION

The present invention relates to a method of manufacturing a semiconductor device comprising stacked chips and a corresponding semiconductor device.

BACKGROUND OF THE INVENTION

Although the invention can in principle be applied to any method of manufacturing a semiconductor device comprising stacked chips, the invention and its underlying problem will be hereinafter explained for a manufacturing method of a semi-conductor memory device comprising two memory chips.

Modern electronic articles, like computers, mobile phones, cameras, are composed of a plurality of individual electronic devices including semiconductor memory devices. It is requested for the manufacturing process to reduce the amount of individual electronic devices in order to shorten the manufacturing time of the electronic articles. Therefore, several memory chips are grouped within a single semiconductor memory device such that these memory chips may be arranged in the electronic article by a single manufacturing step. Further, it is requested to miniaturize the electronic articles. By grouping or a pre-integration of the memory chips within a single housing a higher integration density of the memory chips may be achieved and thus their external dimensions reduced.

Figure 1:
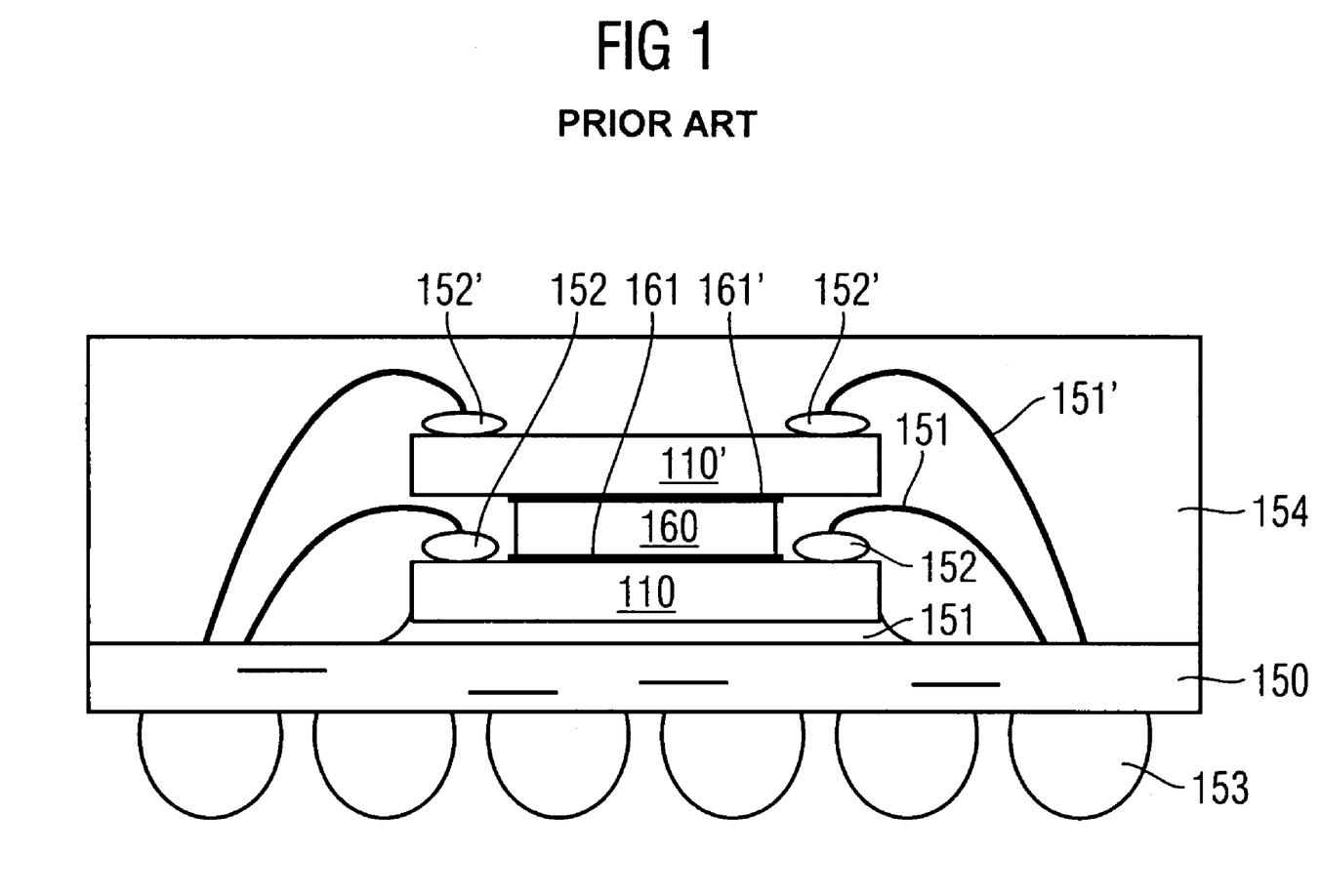
FIG. 1 illustrates a commonly known semiconductor device with stacked chips.

One generally known semiconductor memory device comprises two memory chips as illustrated in FIG. 1. A first memory chip 110 is placed on an interposer substrate 150 and electrically connected with the interposer substrate 150 via contacting pads 152 and bonding wires 151. The contacting pads 152 are arranged along a border of an active surface of the first memory chip 110. A spacer 160 is fixed by an adhesive layer 161 to the active surface of the first chip 110 in an area between the contacting pads 152. A second memory chip 110' is fixed on top of the spacer 160. The second memory chip 110' is as well provided with contacting pads 152' at a border of an active surface of the second memory chip 110'. The contacting pads 152' are connected via bonding wires 151' with the interposer substrate 150. The above described arrangement allows an interconnection of the memory chip 110 and the second memory chip 110' via the interposer substrate 150, and thus the amount of external contacts 153 may be reduced. Additionally, the space occupied by the two memory chips 110, 110' integrated within one housing 154 is significantly reduced compared to two semiconductor memory devices comprising each an encapsulated single memory chip.

The bonding wires 151, 151' should be applied with a minimal pressure to the contacting pads 152, 152'. As the spacer 160 provides no mechanical support to the border of the second memory chip 110', i.e. to the area of the contact pads 152', the contacting of the bonding wires 151' leads to a significant mechanical stress within the second memory chip 110'. In order to avoid damages of the second memory chip 110', its thickness cannot be further reduced. Additionally, the spacer 160 itself contributes to the height of the semiconductor device. Thus a further reduction of the external dimensions of the semiconductor memory device is not feasible with the aforementioned concept.

A further drawback of the above structure resides in the fact that each bonding wire 151, 151' must be individually contacted with the contacting pads with a bonding machine during a manufacturing process. These bonding steps significantly contribute to the manufacturing and thus the costs of the semiconductor memory device.

SUMMARY OF THE INVENTION

The present invention provides an improved method of manufacturing a semiconductor device comprising stacked chips.

One embodiment of the present invention is to provide a method of manufacturing a semiconductor device comprising stacked chips wherein a height of the semiconductor device is reduced. A further embodiment is to reduce the time necessary for the manufacturing of an encapsulated semiconductor device.

According to one embodiment of the present invention, there is manufacturing method and an inventive semiconductor device. The inventive method of manufacturing a semiconductor device comprising stacked chips comprises a first reconstituted wafer is formed comprising a first plurality of chips horizontally separated by a first gap filled with a mould wherein contact pads of the first chips are arranged in an active surface of the first reconstituted wafer. A first redistribution layer is formed on the active surface of the first reconstituted wafer wherein the first redistribution layer contacts contact pads of first chips and extends on the mould. In parallel, before and/or after the above steps, a second reconstituted wafer is formed comprising a second plurality of chips horizontally separated by a second gap filled with a mould wherein contact pads of the second chips are arranged in an active surface opposite to a backside of the second reconstituted wafer. The second reconstituted wafer is diced along the second gap such that individualized embedded chips are formed having tilted sidewalls defining an angle of more than 90 degrees with respect to the active surface of the reconstituted wafer. The embedded chips are placed with the backside on the active surface of the first reconstituted wafer on the first redistribution layer. Afterwards, a second redistribution layer is formed on the active surface of the embedded chips and tilted sidewalls wherein the second redistribution layer connects contact pads of the second chips with the first redistribution layer.

The inventive semiconductor device comprises at least a first chip with a horizontally adjacent first mould and a second chip with a horizontally adjacent second mould wherein the second chip is arranged on an active surface of the first chip, wherein at least the second mould comprises a tilted sidewall and the first mould has a larger horizontal dimension than the second mould. A redistribution layer is provided on the active surfaces of the chips providing an interconnection on the contact pads of the chips wherein the redistribution layer is guided over the tilted sidewall. A carrier with contact pads is connected with the redistribution layer in the area of the first mould.

In the present invention, a plurality of chips may be processed in parallel when they are arranged in the first reconstituted wafer or on the first reconstituted wafer. Thus, the first and the second redistribution layer are formed in one step for a plurality of chips.

Another feature of the present invention is to provide the embedded chips with tilted sidewalls. Thus, it is possible to guide the second redistribution layer over the tilted sidewall and thus connecting the second redistribution layer on the active surface of the embedded chip with the first redistribution layer extending on the mould. Thus, it is not necessary to provide vias or bonding wires in order to contact the contacting pads of the upper second chip. It is understood that not all wires of the second redistribution layer which are guided over the tilted sidewalls need to be connected to the first redistribution layer. The second redistribution layer extending over the tilted sidewalls allows to contact the second redistribution layer on the lower or lowest embedded chip. Advantageously, this way the height of the stack is reduced, as no contacts are placed on top of the stack.

It is understood that the tilted sidewalls forming an angle of more than 90 degrees with respect to the active surface of the second reconstituted wafer is to be understood in that the embedded chip is provided with a larger surface at its backside compared with the active surface.

According to one embodiment, the first reconstituted wafer is diced along the first gap, after the second redistribution layer is formed, thus providing an interconnected chip staple.

According to a preferred embodiment, a fourth embedded chip is placed with its backside on an active surface of a third embedded chip after a formation of a third redistribution layer on the active surface of the third embedded chip and a fourth redistribution layer is formed on the active surface of the fourth embedded chip. The third embedded chip may be the second embedded chip and the third redistribution layer with a second redistribution layer. Thus, chip staples of three and more chips may be formed.

According to a further embodiment, the first gap is broader than the second gap. Thus, when the embedded chip is placed on the first chip, parts of the mould in the first gap remain exhibited such that the second redistribution layer may be applied on said mould and brought into contact with the first redistribution layer.

According to a further preferred embodiment, the interconnected chip staple is placed on a carrier, and the first redistribution layer is contacted with contact areas provided on the carrier.

BRIEF DESCRIPTION OF THE DRAWINGS

Exemplary embodiments of the invention are illustrated in the drawings and explained in more detail in the following description.

In the FIG. 2–20, identical reference numerals denote identical or functionally equivalent parts.

DETAILED DESCRIPTION OF THE INVENTION

Figures 2, 3:
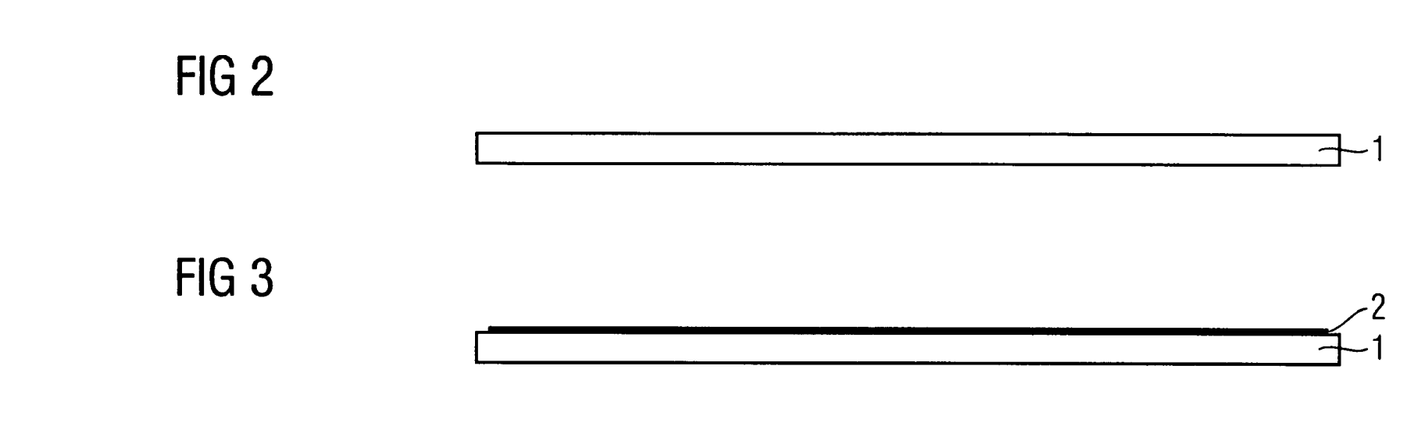
FIG. 2–19 illustrate steps of a version of the inventive method.
Figure 4:
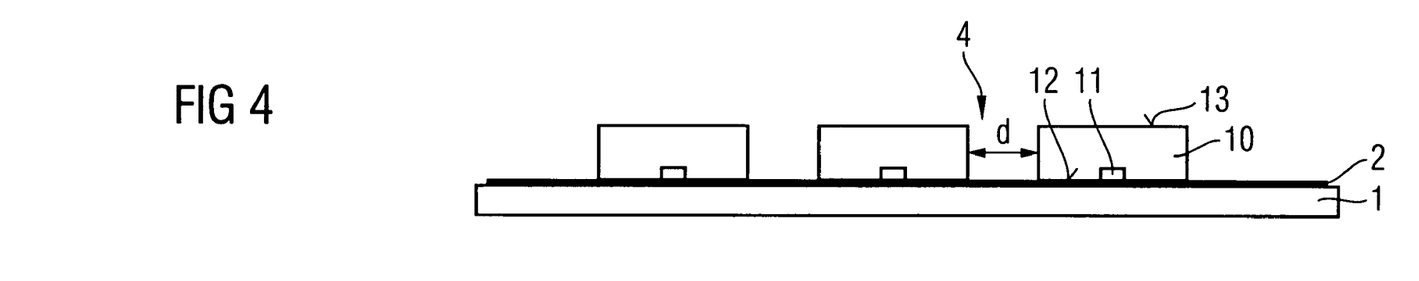

An intermediate carrier 1 or a carrier plate is provided in a first step (FIG. 2). An adhesive layer 2 or an adhesive tape is attached to the intermediate carrier 1 (FIG. 3). One or more processed semiconductor wafers are diced and the individualized chips 10 are provided. These chips 10 may be identical in functionality and/or its dimensions or be different. The chips 10 are arranged on the intermediate carrier 1 horizontally spaced by a gap 4 between two neighboring chips 10. A width d of the gap 4 (distance between to neighboring chips 10) is preferably identical for all gaps 4 between neighboring chips 10. Each chip 10 is placed with its active surface 12 on the intermediate carrier 1. The active surface 12 is defined by the surface of the chip 10 which comprises contact pads 11. Thus, the active surface 12 is covered by the intermediate carrier 1 and a backside 13 opposite to the active surface 12 remains exhibited (FIG. 4).

Figure 5:
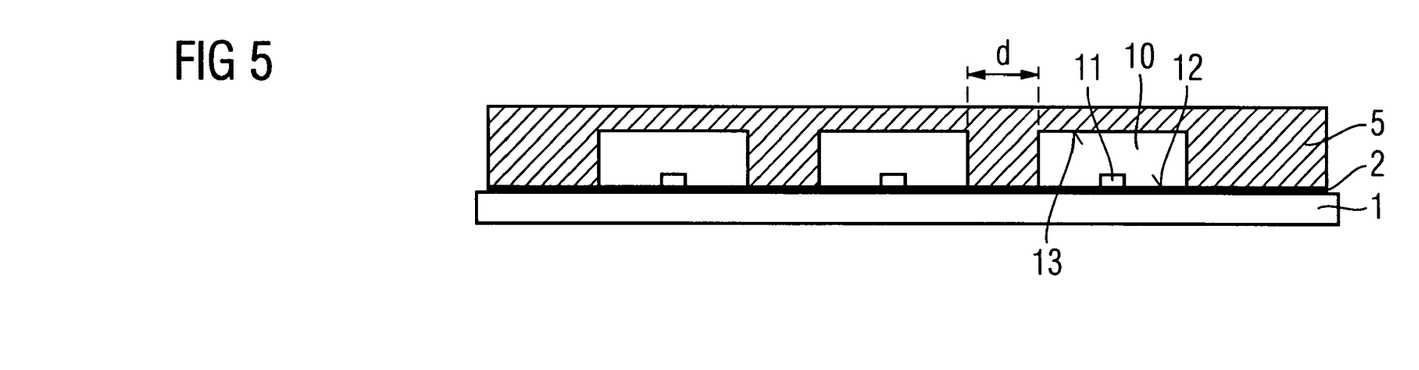
Figure 6:
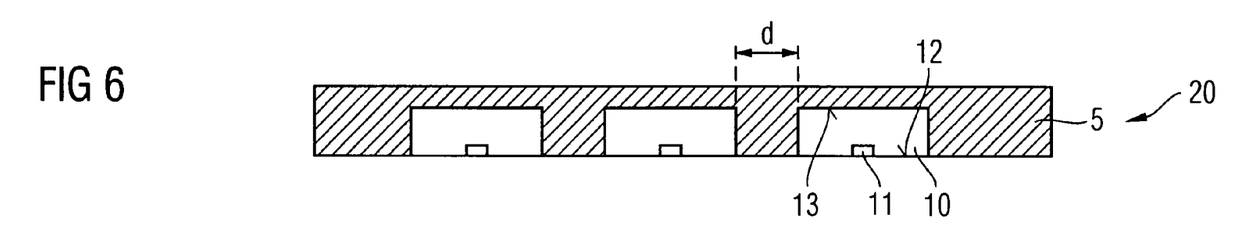

In a subsequent step, a mould 5 is applied on the above structure. The mould 5 is deposited such that the chips 10 are embedded in this mould (FIG. 5). The mould 5 may comprise a resin or a polymer. Subsequently, the intermediate carrier 1 and the adhesive layer 2 are removed (FIG. 6). It remains a basic reconstituted wafer 20 comprising a plurality of chips 10 embedded in the mould 5. The active surfaces 12 of the chips 10 are exposed.

Figure 7:
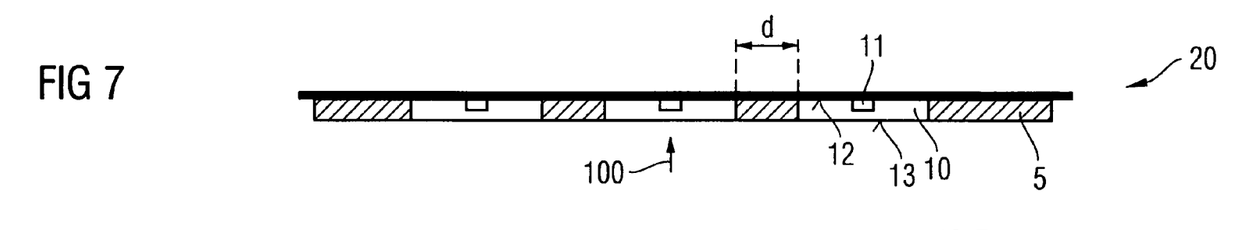

Optionally, a polishing step may remove or thin the mould 5 on a surface opposite to the active surface 12 from a direction 100. The direction 100 is preferably vertical to the active surface 12 of the chips 10. This polishing step may as well reduce the thickness of the chips 10 (FIG. 7).

Figure 8:
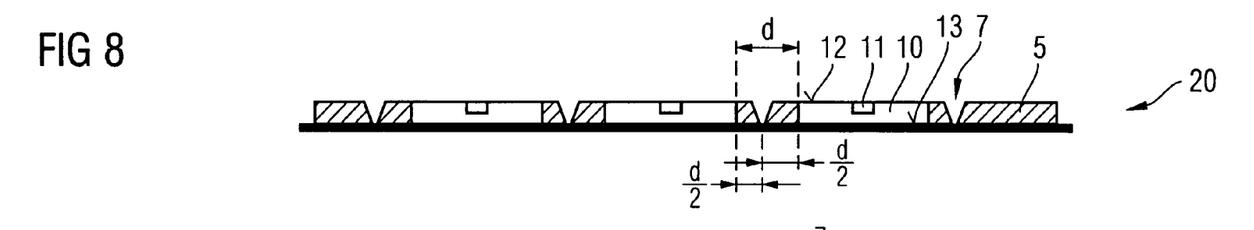
Figure 9:
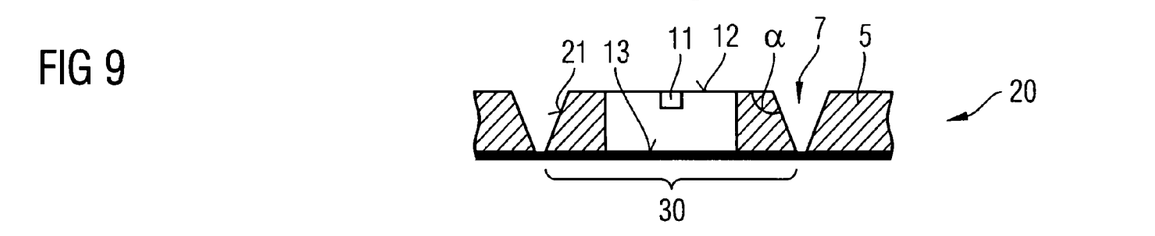
Figure 10:
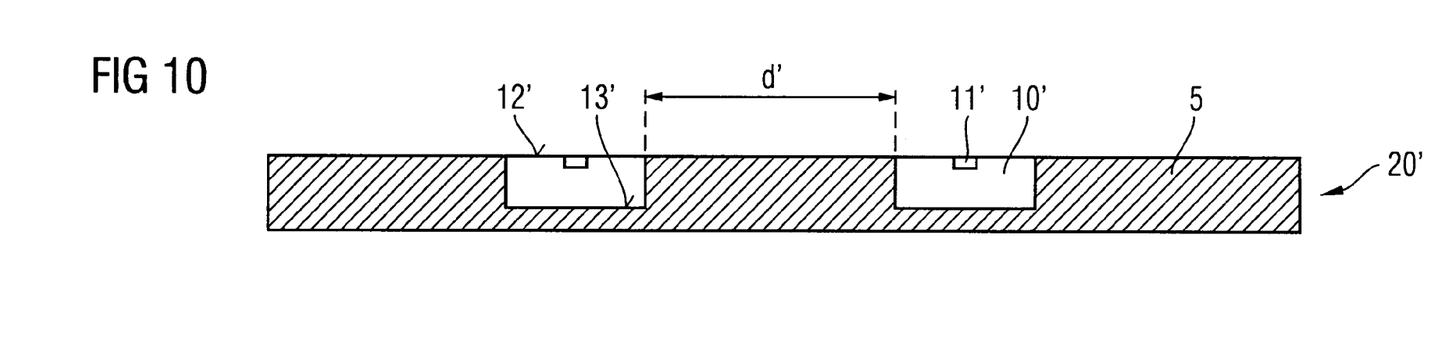

The basic reconstituted wafer 20 is placed with its backside 13, i.e. the backsides 13 of the memory chips 10, onto a dicing layer. The basic reconstituted wafer 20 is diced along the gaps 4, thus forming openings 7 in the mould 5 (FIG. 8). After the dicing step the chips 10 are individualized having horizontally adjacent parts of the mould 5. In the following, the chip 10 having horizontally adjacent parts of the mould 5 will be called embedded chip 30 (FIG. 9). Sidewalls of the embedded chip 30 are tilted, e.g. an angle α formed by the sidewall 21 and the active surface 12 of the embedded chip 30 is larger than 90 degrees. This may be achieved by dicing the basic reconstituted wafer 20 with a vee-shaped blade or by cutting the basic reconstituted wafer 20 under an angle of more than 90° with respect to the active surface 12.

A first reconstituted wafer 20' is formed similar or identical to the steps described along with the formation of the basic reconstituted wafer 20 and the FIGS. 2 to 7. The first reconstituted wafer 20' may comprise different or identical chips 10' compared to the basic reconstituted wafer 20. The distance d' between two neighboring chips 10' is preferably larger than the distance d between two neighboring chips 10 of the basic reconstituted wafer 20.

Figure 11:
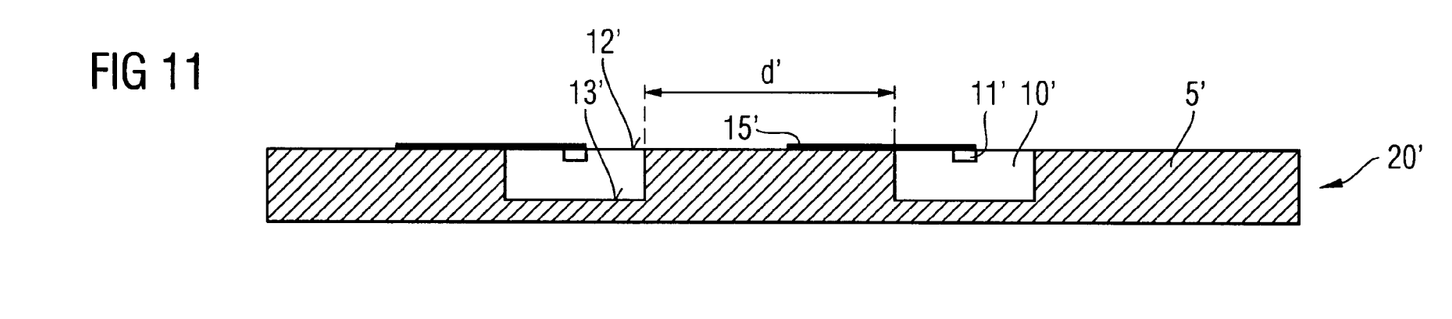
Figure 12:
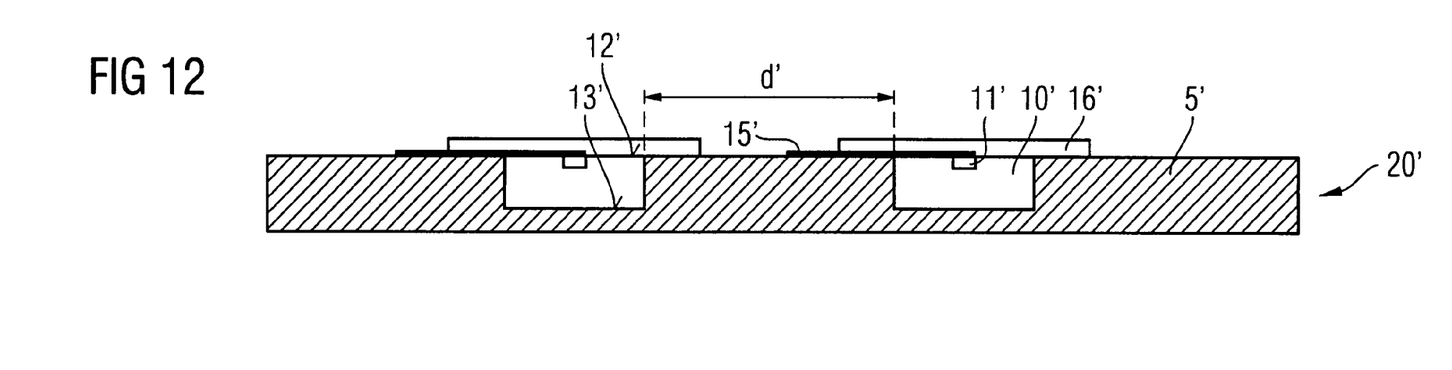

A first redistribution layer 15' is formed on the active surface 12' of the first reconstituted wafer 20'. The first redistribution layer 15' contacts the contact pads 11' of the first chips 10' and extends onto the mould 5' (FIG. 11). An adhesive layer 16' is applied on top of the first chips 10' and/or the active surface 12' of the first reconstituted wafer 20' (FIG. 12).

Figure 13:
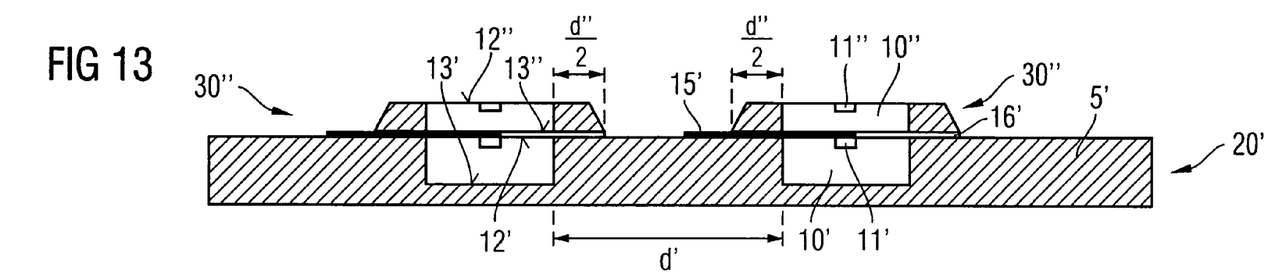

Embedded chips 30", preferably formed like the embedded chips 30 described along with FIG. 9, are placed on the adhesive layer 16'. The embedded chips 30" are orientated such that the backside 13" points towards the first reconstituted wafer 20'. The embedded chips 30" are formed via a second reconstituted wafer 20" wherein the gap d" between two neighboring chips 10" is significantly smaller than the gap d' between two first chips 10' in the first reconstituted wafer 20'. In one example, the gap in the second reconstituted wafer has a width d", and after the dicing of the second reconstituted wafer, each embedded chip 30" comprises a horizontally adjacent mould 5" with a width d"/2. In this particular example, d' is significantly larger than d". The extension of the first redistribution layer 15' on the mould 5' is longer than the width d"/2 of the remaining mould 5" of the embedded chips 30". Thus, at least a part of the first redistribution layer 15' is not covered by the embedded chip 30" (FIG. 13).

Figure 14:
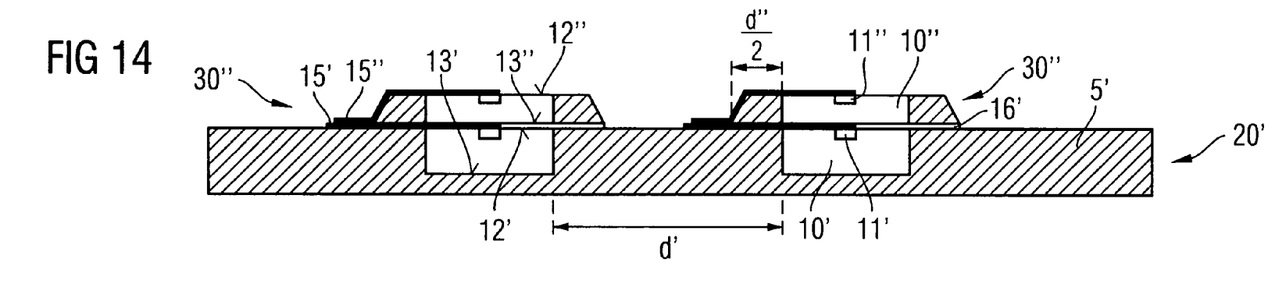

Afterwards, a second redistribution layer 15" is formed on the active surface 12' of the embedded chips 30" contacting the contact pads 11". The second redistribution layer 15" is as well applied onto the tilted sidewalls 21" of the embedded chip 30". Thus, a contact of the first redistribution layer 15' with the second redistribution layer 15" may be obtained (FIG. 14). Further, parts of the second redistribution layer 15" may be formed such that they are not in contact with the first redistribution layer 15', however, extending to the active surface 12' on the first reconstituted wafer 20'. The formation of the redistribution layers 15' and 15" may comprise deposition techniques and lithographic steps as generally known in the present state of the art.

Figure 15:
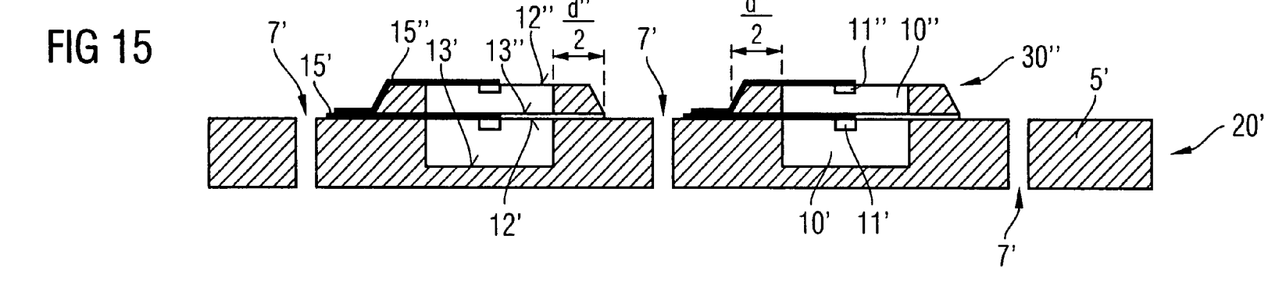

In a subsequent step, the first reconstituted wafer 20' is diced along 7' such that individual staples of stacked chips 10', 10" are formed comprising the two redistribution layers 15', 15" providing interconnections of the first with the second chip 10", 10" (FIG. 15).

Figure 16:
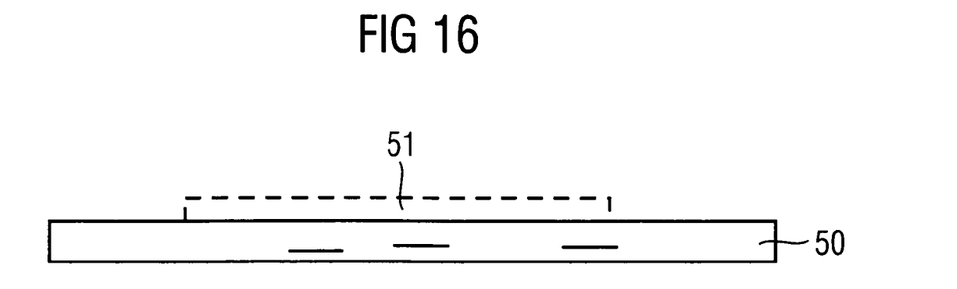
Figure 17:
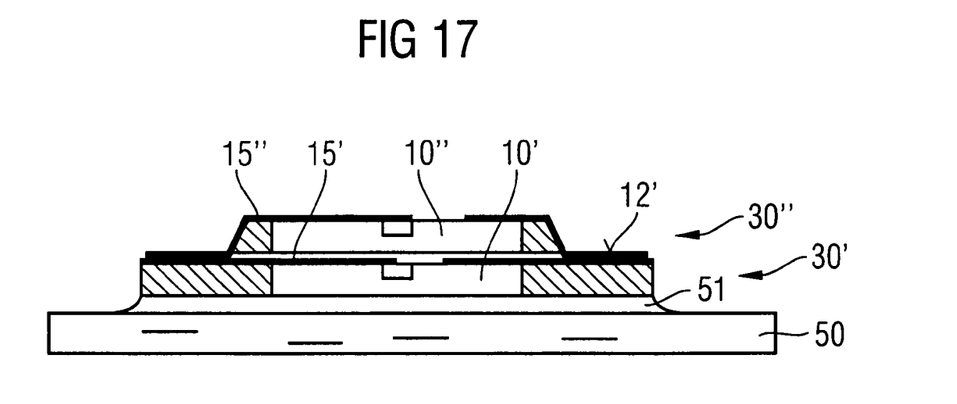
Figure 18:
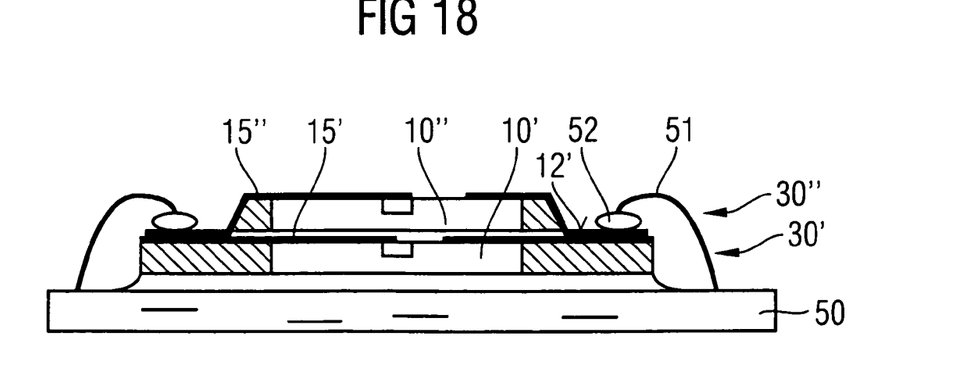

In the following, optional steps for encapsulating or packaging the above described stacked chips 40 will be described. An interposer substrate or any other carrier 50 is provided with an adhesive layer 51 on an upper surface of the carrier 50 (FIG. 16). A staple with stacked chips 40 is deposited onto the adhesive layer 51 (FIG. 17). Bonding wires 51 are connected with contact pads 52 provided on the active surface 12' of the lowest embedded chip 30'. Contacting pads 52 may be only provided on the active surface 12" of the first embedded chip 30'. As no bonding wires need to be attached to the upper embedded chip 30" the height of the semiconductor device is kept minimal (FIG. 18).

Figure 19:
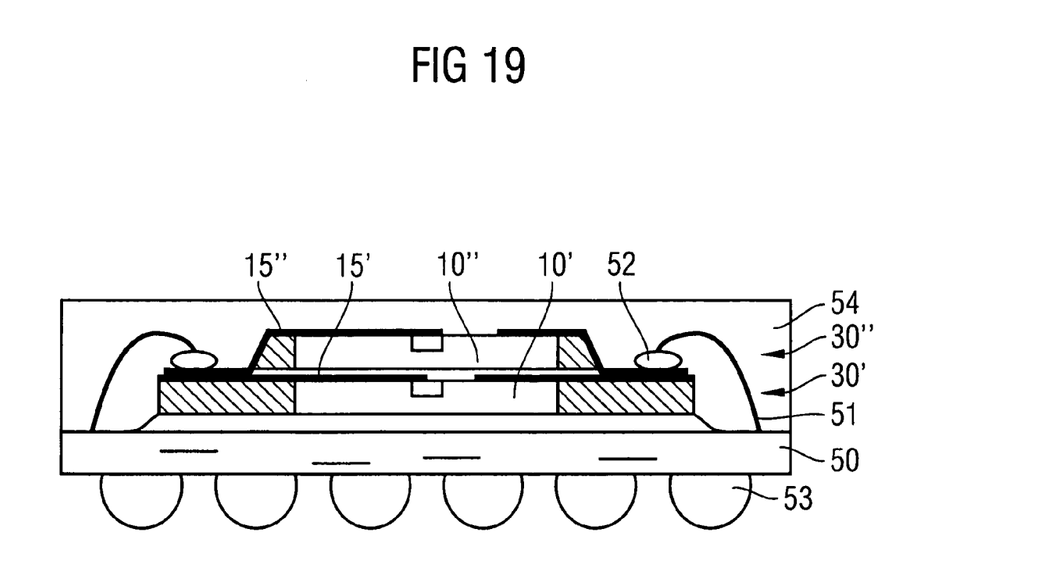

For finalizing the semiconductor device, the stacked chips 10', 10" are covered by a resin 54 and/or external contacting points 53 are arranged at the interposer substrate 50 (FIG. 19).

Instead of contacting the first and second redistribution layer 15', 15" via bonding wires 51, the interconnection layers may be as well guided over tilted sidewalls of the lowest embedded chip down to a level of the backside 13' of the first embedded chip 30'. Accordingly, the first reconstituted wafer 20' must be diced in a fashion providing tilted sidewalls similar to the formation of the embedded chips 30 described along with FIG. 8.

Figure 20:
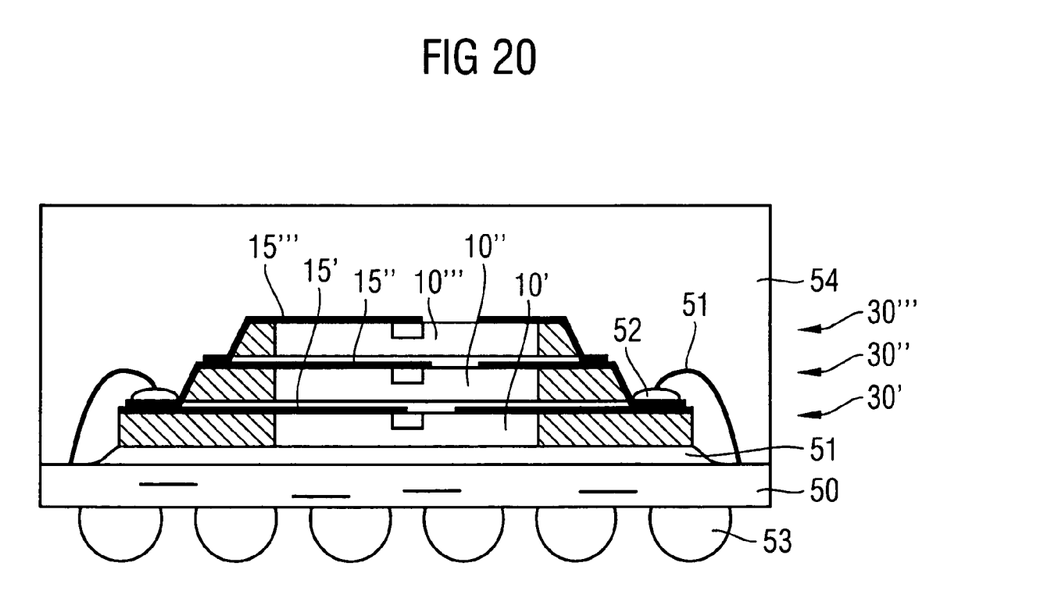
FIG. 20 illustrates a second embodiment of a semiconductor device according to the present invention.

The present invention is not limited to stacks of two chips. FIG. 20 illustrates an example of three stacked chips 30', 30", 30'". It should be noted that the diameter increases from the uppermost embedded chip 30'" down to the lowest embedded chip 30'. This makes it possible to guide the redistribution layer 15'" from the uppermost embedded chip 30'" down to the active surface 12' of the lowest embedded chip 30'.

Although the present invention has been described above on basis of preferred exemplary embodiments, it is not restricted to these embodiments, but can rather be modified in numerous ways.

In particular, additional structures may be provided between the embedded chips.

REFERENCE NUMERALS

1 intermediate carrier
2 adhesive layer
4 gap
d, d', d" distance
5, 5', 5" mould
7 openings
10, 10', 10", 10'" chip
11, 11', 11" contact pad
12, 12', 12" active surface
13, 13', 13" back side
15', 15", 15'" redistribution layer
16', 16" adhesive layer
20, 20', 20" basic, first, second reconstituted wafer
21 side wall
30, 30', 30", 30'" embedded chip
51 bonding wire
52 contacting pad
53 external contacting point
54 resin
100 polishing direction
α angle
110, 110' chip
150 interposer
151, 151' bonding wire
152, 152' contact pad
153 external contact
160 spacer
161, 161' adhesive layer

What is claimed is:

1. A method of manufacturing of a semiconductor device having stacked chips comprising:

forming a first reconstituted wafer having a first plurality of chips horizontally separated by a first gap filled with a mould, wherein contact pads of the first chips are arranged in an active surface of the first reconstituted wafer;

forming a first redistribution layer on the active surface of the first reconstituted wafer, the first redistribution layer contacting contact pads of first chips and extending on the mould;

forming a second reconstituted wafer having a second plurality of chips horizontally separated by a second gap filled with a mould, wherein contact pads of the second chips are arranged in an active surface opposite to a back side of the second reconstituted wafer;

dicing the second reconstituted wafer along the second gap such that individualized embedded chips are formed having tilted sidewalls defining an angle of more than ninety degrees with respect to the active surface of the second reconstituted wafer;

placing the embedded chips with their back side on the active surface of the first reconstituted wafer and the first redistribution layer; and forming a second redistribution layer on the active surface of the embedded chips and tilted sidewalls the second redistribution layer connecting contact pads of the second chips with the first redistribution layer.

2. The method according to claim 1, wherein the first reconstituted wafer is diced along the first gap after the second redistribution layer is formed thus providing interconnected stacked chips.

3. The method according to claim 2, further comprising:
placing the interconnected chip staple on a carrier; and
contacting the first redistribution layer with the contact areas provided on the carrier.

4. The method according to claim 3, wherein the first redistribution layer is contacted via bonding wires.

5. The method according to claims 1, where in after a formation of a third redistribution layer on an active surface of a third embedded chip a forth embedded chip is placed with its backside on the active surface of the third embedded chip; and a forth redistribution layer is formed on the active surface of the forth embedded chip.

6. The method according to claim 5, wherein the third embedded chip is the second embedded chip and the third redistribution layer is the second redistribution layer.

7. The method according to claim 1, wherein the first gap is broader than the second gap.

* * * * *